(12) United States Patent
Chau

(10) Patent No.: US 6,538,278 B1
(45) Date of Patent: *Mar. 25, 2003

(54) CMOS INTEGRATED CIRCUIT HAVING PMOS AND NMOS DEVICES WITH DIFFERENT GATE DIELECTRIC LAYERS

(75) Inventor: Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/568,858

(22) Filed: May 9, 2000

Related U.S. Application Data

(62) Division of application No. 08/969,624, filed on Nov. 13, 1997, now abandoned, which is a division of application No. 08/810,682, filed on Feb. 28, 1997.

(51) Int. Cl.[7] .............................................. H01L 29/792
(52) U.S. Cl. ...................... 257/324; 257/325; 257/369; 257/374; 257/410; 257/411; 257/506
(58) Field of Search ................................. 257/324, 325, 257/369, 374, 403, 410, 411, 506

(56) References Cited

U.S. PATENT DOCUMENTS

| | | | |
|---|---|---|---|
| 4,200,474 A | 4/1980 | Morris ........................ 148/1.5 |
| 4,266,985 A | 5/1981 | Ito et al. ..................... 148/1.5 |
| 4,651,406 A | 3/1987 | Shimizu et al. ............... 29/571 |
| 4,869,781 A | 9/1989 | Euen et al. ................... 156/643 |
| 5,237,188 A | 8/1993 | Iwai et al. .................... 257/325 |
| 5,241,208 A | 8/1993 | Taguchi ....................... 257/410 |
| 5,244,843 A | 9/1993 | Chau et al. .................. 437/239 |
| 5,254,489 A | 10/1993 | Nakata ......................... 437/40 |
| 5,258,645 A | 11/1993 | Sato ............................ 257/637 |
| 5,327,002 A | 7/1994 | Motoyoshi ................... 257/380 |
| 5,432,114 A | 7/1995 | O ................................. 437/56 |
| 5,449,637 A | 9/1995 | Saito et al. ................... 437/57 |
| 5,464,783 A | 11/1995 | Kim et al. |
| 5,480,828 A | 1/1996 | Hsu et al. |
| 5,497,021 A | 3/1996 | Tada .......................... 257/369 |
| 5,502,009 A | 3/1996 | Lin ............................. 437/239 |
| 5,528,068 A | 6/1996 | Ohmi .......................... 257/410 |
| 5,532,181 A | 7/1996 | Takebuchi et al. ............ 437/43 |
| 5,576,226 A | 11/1996 | Hwang ........................ 437/24 |
| 5,578,848 A | 11/1996 | Kwong et al. ............... 257/296 |
| 5,596,218 A | 1/1997 | Soleimani et al. ........... 257/369 |
| 5,633,202 A | 5/1997 | Bringham et al. ........... 438/763 |
| 5,668,028 A | 9/1997 | Bryant ........................ 438/287 |
| 5,714,788 A | 2/1998 | Ngaoaram ................... 257/411 |
| 5,716,863 A | 2/1998 | Arai ............................ 437/41 |
| 5,763,922 A | * 6/1998 | Chau .......................... 257/371 |
| 6,048,769 A | 4/2000 | Chau |
| 6,060,755 A | * 5/2000 | Ma et al. ..................... 257/410 |
| 6,255,698 B1 | * 7/2001 | Gardner et al. ............. 257/369 |

* cited by examiner

Primary Examiner—Olik Chaudhuri
Assistant Examiner—Wai-Sing Louie
(74) Attorney, Agent, or Firm—Blakely, Sokoloff, Taylor & Zafman LLP

(57) ABSTRACT

A CMOS integrated circuit having a PMOS and NMOS device with different gate dielectric layers. According to the present invention, an NMOS transistor is formed on a p-type conductivity region of a semiconductor substrate. The NMOS transistor has first gate dielectric layer formed on the p-type conductivity region. A PMOS transistor is formed on a n-type conductivity region of the semiconductor substrate. The PMOS transistor has a second gate dielectric layer wherein the second gate dielectric layer has a different composition than the first gate dielectric layer.

21 Claims, 8 Drawing Sheets

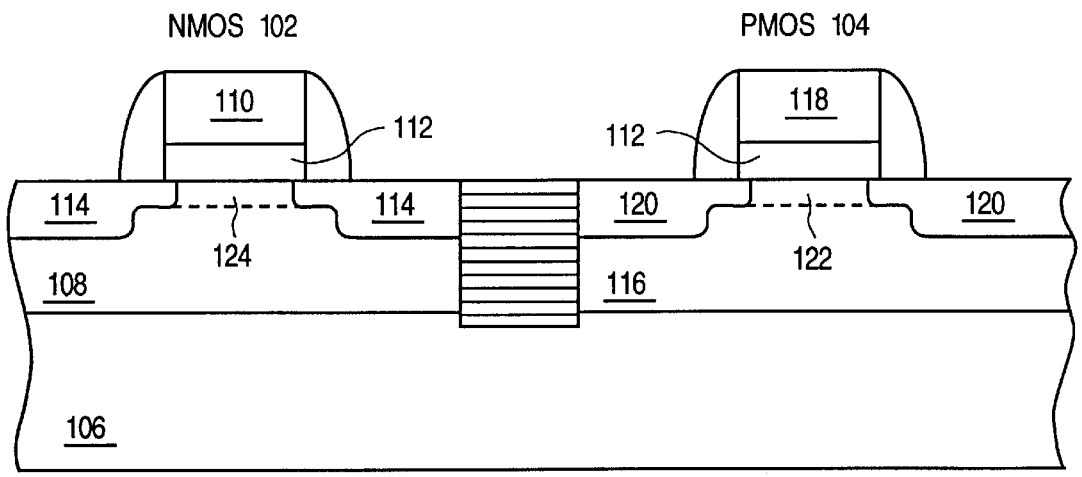
FIG_1 PRIOR ART
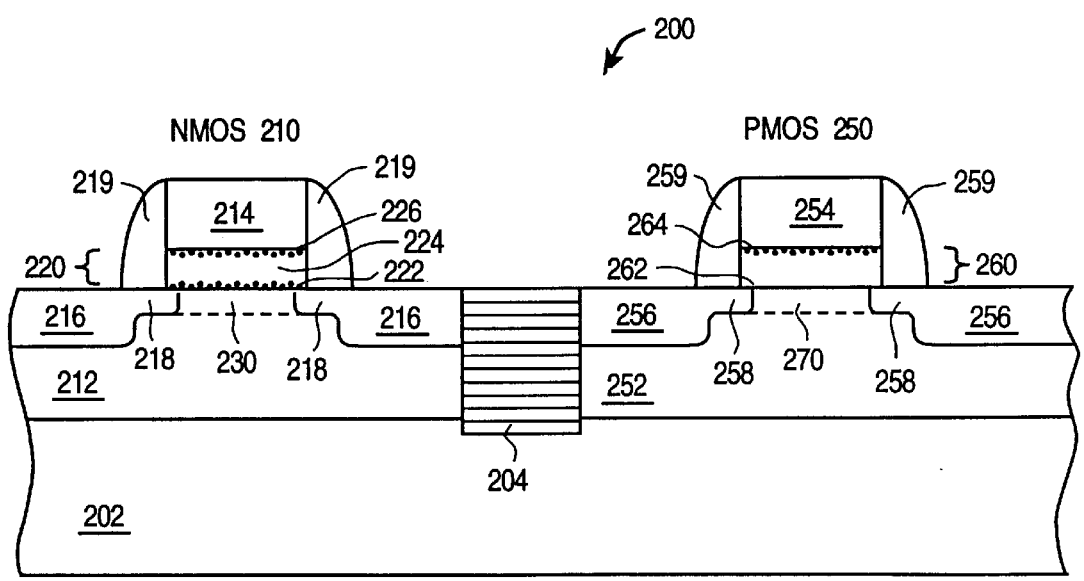
FIG_2

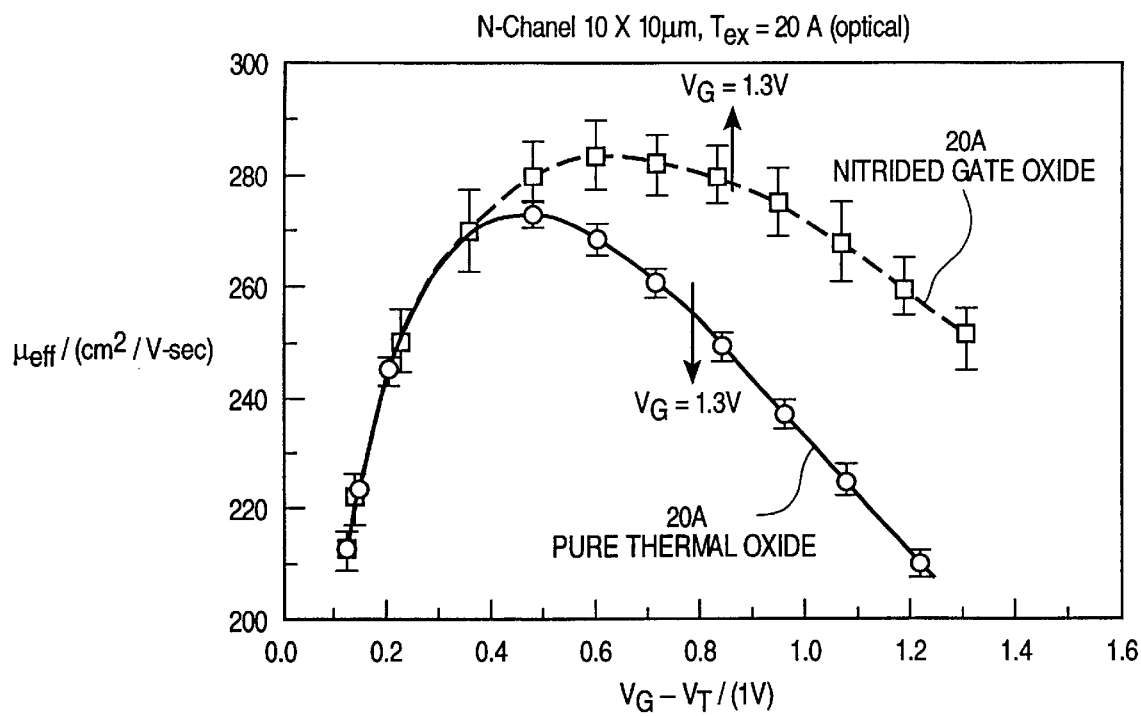
FIG_3A
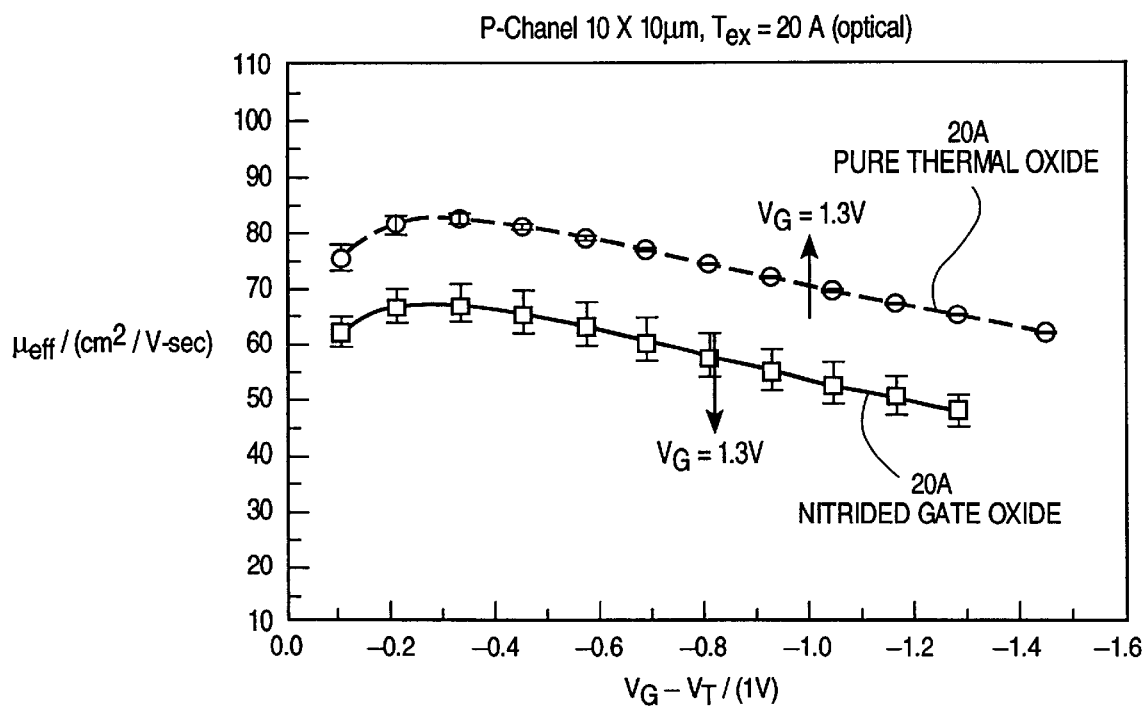
FIG_3B

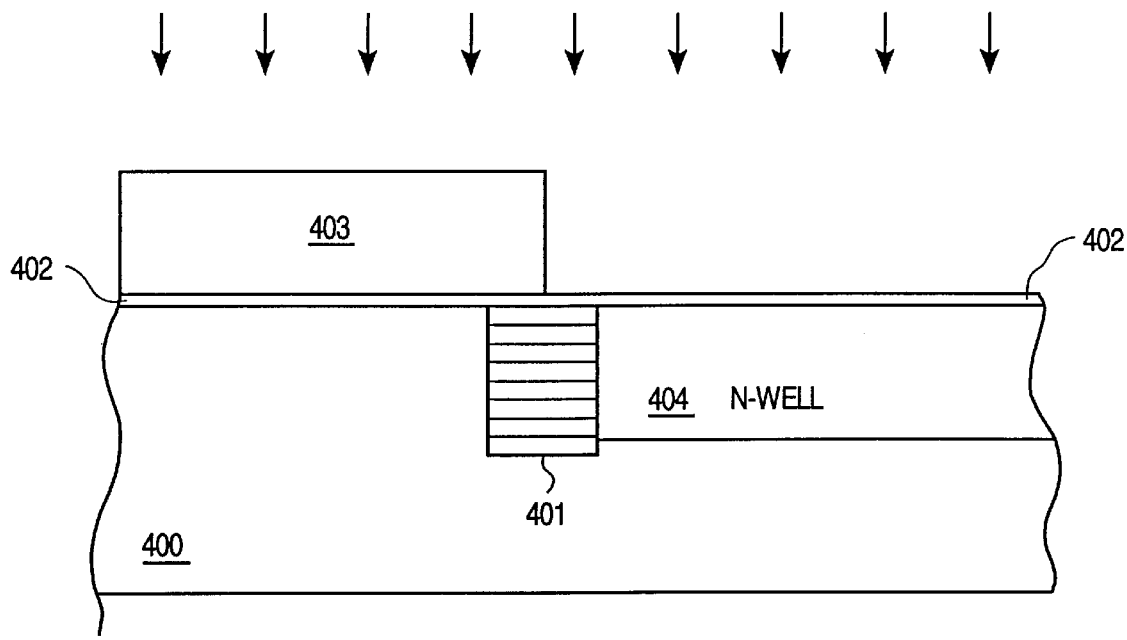
FIG_4A
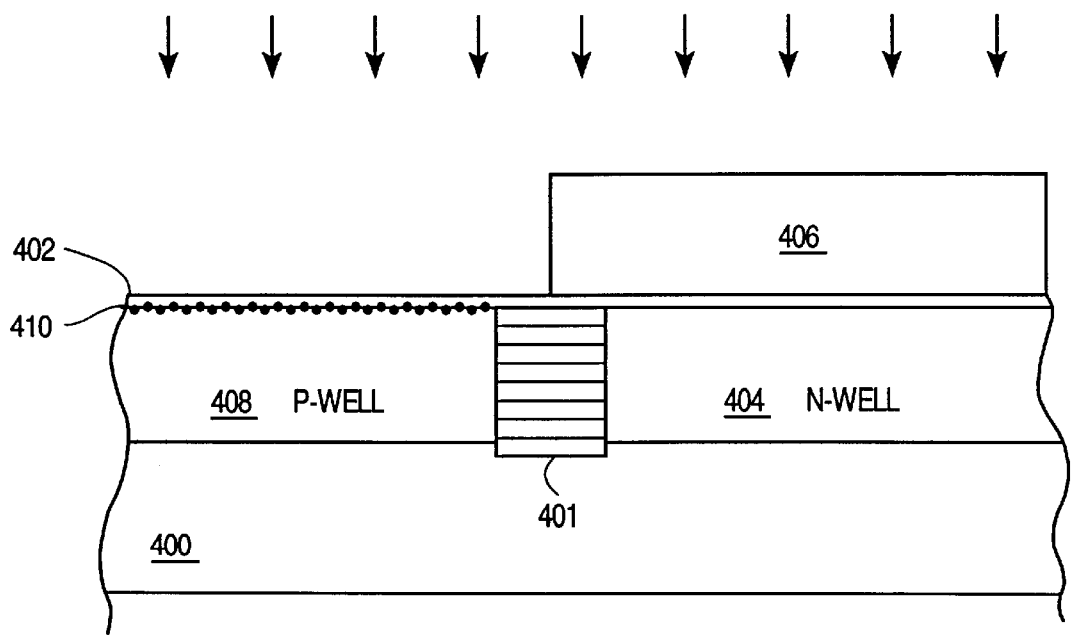
FIG_4B

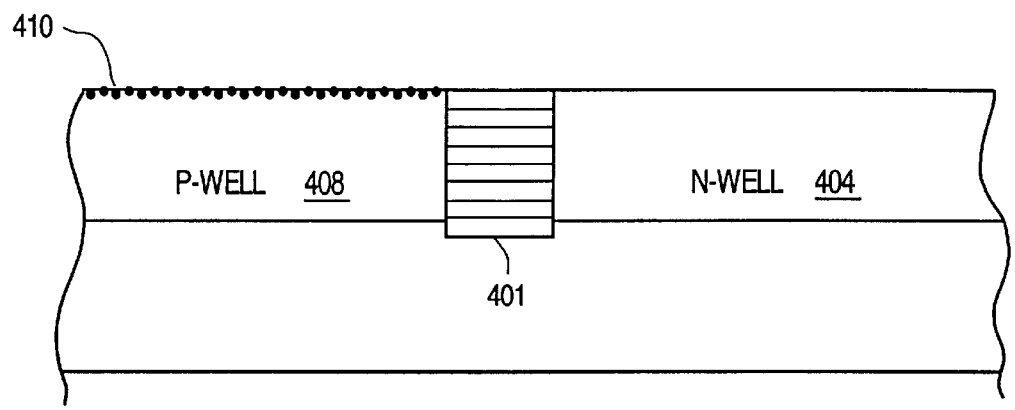
FIG_4C
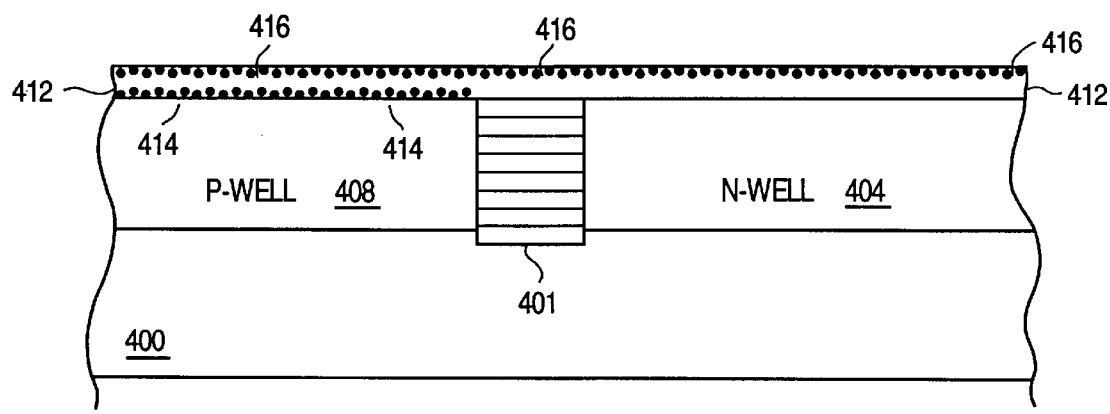
FIG_4D

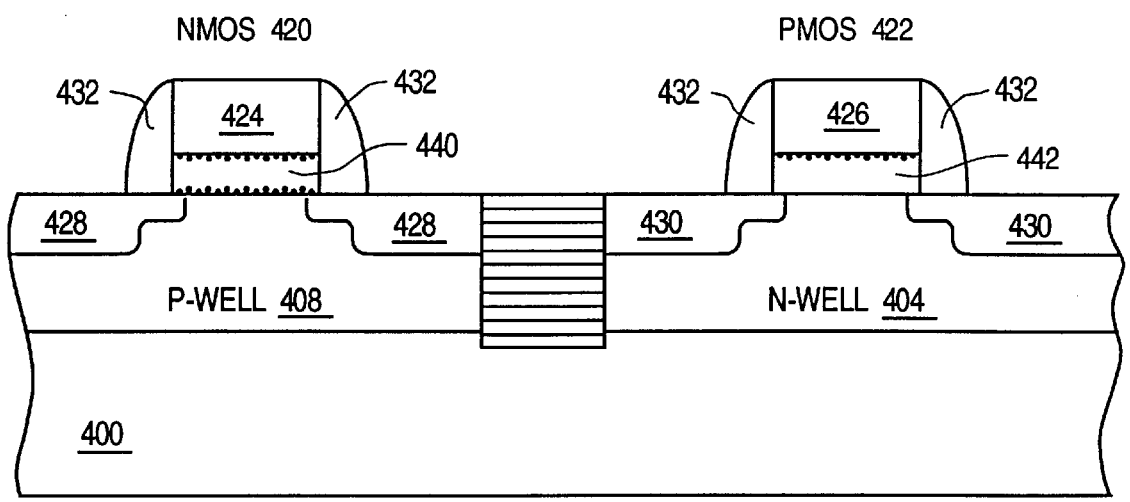
FIG_4E

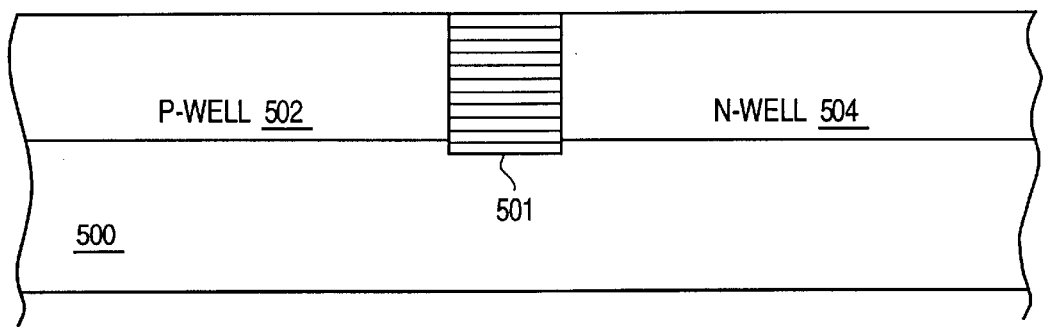
FIG_5A
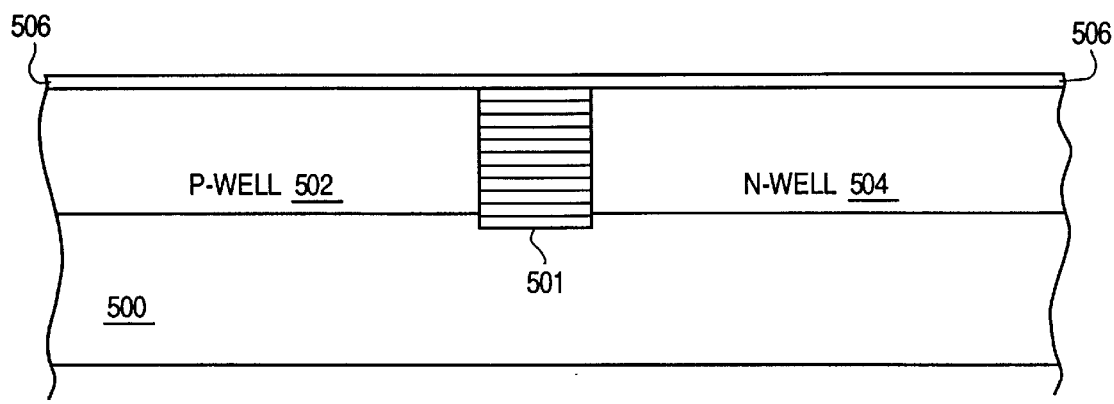
FIG_5B

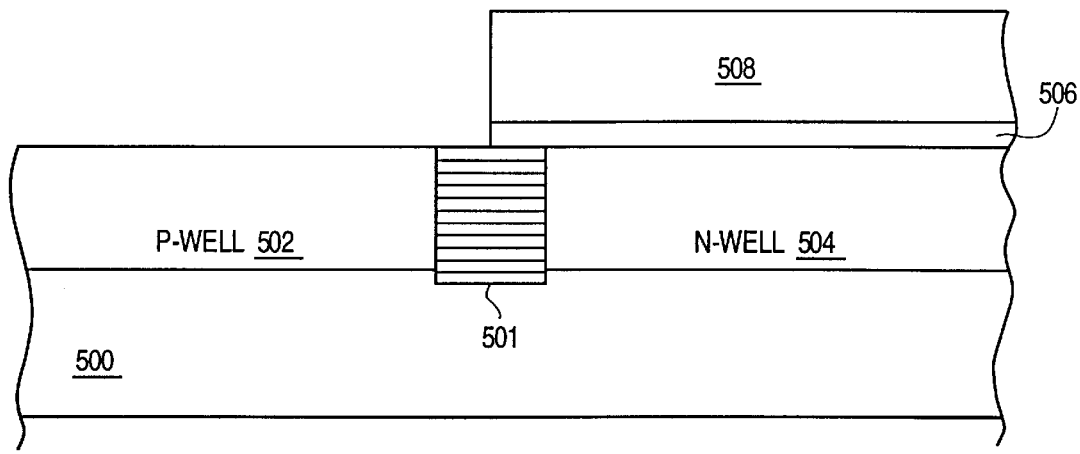
FIG_5C
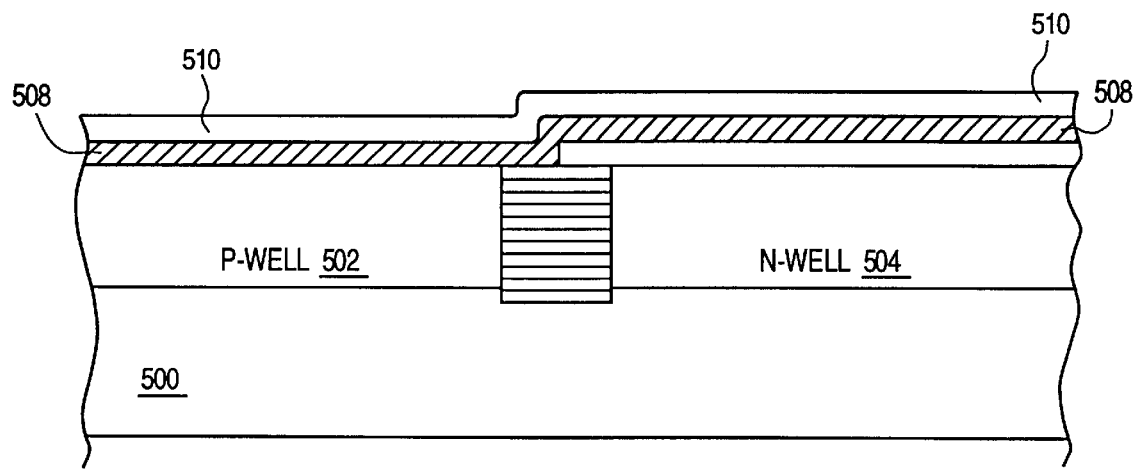
FIG_5D

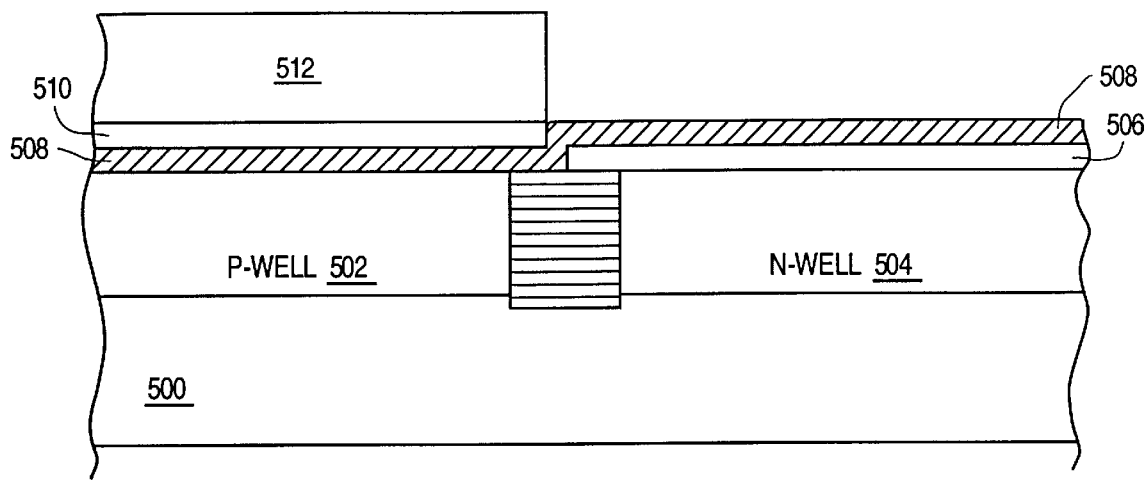
FIG_5E
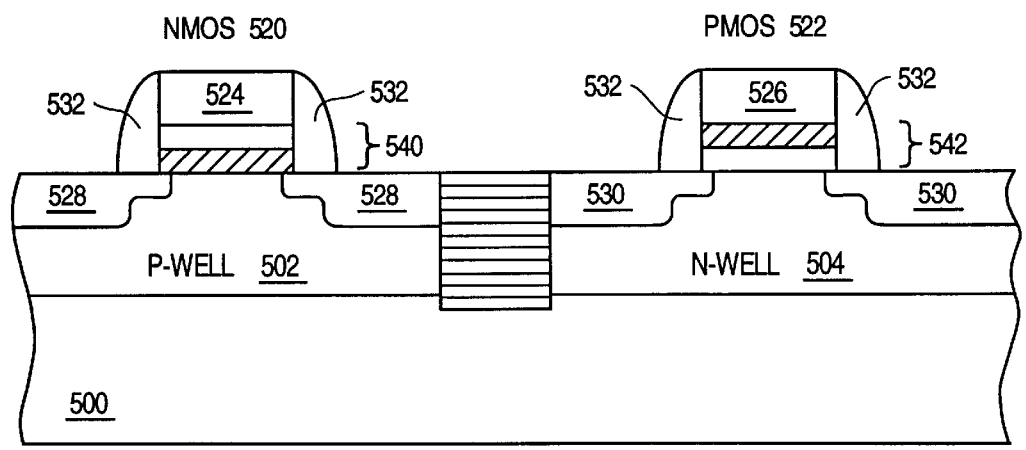
FIG_5F

US 6,538,278 B1

CMOS INTEGRATED CIRCUIT HAVING PMOS AND NMOS DEVICES WITH DIFFERENT GATE DIELECTRIC LAYERS

This is a Divisional Application of prior application Ser. No. 08/969,624 filed Nov. 13, 1997 now abandoned which is a Divisional Application of prior application Ser. No. 08/810,682 filed Feb. 28, 1997.

BACKGROUND OF THE INVENTION

1. Field of the Invention

The present invention relates to the field of semiconductor integrated circuits and more specifically to a CMOS integrated circuit wherein the PMOS and NMOS transistors have different dielectric properties.

2. Discussion of Related Art

Complimentary metal oxide semiconductor (CMOS) integrated circuits are widely used in logic applications such as in the design of very large scale integrated circuits such as in microprocessor and microcontrollers.

As shown in FIG. 1, a CMOS integrated circuit 100 contains both n-type MOS (NMOS) transistors and p-type MOS (PMOS) transistors formed on a single substrate 106. NMOS device 102 is formed on a p-type conductivity region 108 of substrate 106 and contains a gate electrode 110 formed on a gate dielectric gate layer 112 and a pair of n-type source/drain regions 114 formed on laterally opposite sides of gate electrode 110. Similarly, PMOS device 104 is formed on a n-type conductivity region 116 of substrate 106 and contains the gate electrode 118 formed on gate dielectric layer 112 and a pair of p-type conductivity source/drain regions 120 formed along opposite sidewalls of gate electrode 118.

In CMOS architecture for digital applications, such as microprocessors, NMOS and PMOS devices 102 and 104, respectively, are operated in the "inversion mode" or they sit idle. To place PMOS transistor 104 in inversion mode, a negative gate voltage, $V_{gs} < V_t$, is applied to gate electrode 118 of PMOS transistor 104 to form an inversion channel 122 of p-type conductivity between source/drain regions 120 which allows current to flow from one source/drain region 120 to the other source/drain region 120. To place NMOS device 102 in inversion mode, a positive gate voltage, $V_{gs} > V_t$ is applied to gate electrode 110 of transistor 102 to form and inversion channel 124 of n-type conductivity between source/drain regions 114 to allow currents to travel from one. source/drain region 114 to the other source/drain region 114.

Although CMOS integrated circuits are generally more difficult to manufacture because they contain both PMOS and NMOS devices on a single substrate, CMOS devices are necessary in order to reduce power consumption, especially in very large scale (VLSI) circuits such as microprocessors where literally millions of transistors are coupled together.

SUMMARY OF THE INVENTION

A CMOS integrated circuit having a PMOS and NMOS device with different gate dielectric layers is described. According to the present invention, an NMOS transistor is formed on a p-type conductivity region of a semiconductor substrate. The NMOS transistor has first gate dielectric layer formed on the p-type conductivity region. A PMOS transistor is formed on a n-type conductivity region of the semiconductor substrate. The PMOS transistor has a second gate dielectric layer wherein the second gate dielectric layer has a different composition than the first gate dielectric layer.

DESCRIPTION OF THE DRAWINGS

FIG. 1 is an illustration of a cross-sectional view of a conventional CMOS integrated circuit FIG. 2 is an illustration of a cross-sectional view of integrated circuit in accordance with the present invention.

FIG. 3a is an illustration of n-channel effective mobility vs. gate voltage (Vg–Vt) for a 20 Å pure thermal oxide vs. a 20 Å nitrided gate oxide. FIG. 3b is an illustration of the p-channel effective mobility vs. gate voltage (Vg–Vt) for a 20 Å pure thermal oxide vs. a 20 Å nitrided gate oxide.

FIG. 4a is an illustration of a cross-sectional view of a semiconductor substrate showing the formation of an n well.

FIG. 4b is an illustration of a cross-sectional view showing the formation of a p well and a nitrogen rich area in the substrate of FIG. 4a.

FIG. 4c is an illustration of a cross-sectional view showing the removal of a sacrificial oxide layer from the substrate of FIG. 4b.

FIG. 4c is an illustration of a cross-sectional view showing the formation of an oxide layer on the substrate of FIG. 4c.

FIG. 4e is an illustration of a cross-sectional view showing the formation of PMOS and NMOS transistors on the substrate of FIG. 4d.

FIG. 5a is a cross-sectional illustration of a semiconductor substrate.

FIG. 5b is an illustration of a cross-sectional view showing the formation of a thermally grown oxide layer on the substrate of FIG. 5a.

FIG. 5c is an illustration of a cross-sectional view showing the formation of a photoresist mask and removal of a portion of the thermally grown oxide layer from the substrate of FIG. 5b.

FIG. 5d is an illustration of a cross-sectional view showing the formation of a high dielectric constant material and an oxide layer over the substrate of FIG. 5c.

FIG. 5e is an illustration of a cross-sectional view showing the formation of a photoresist mask and the removal of a portion of the oxide layer from the substrate of FIG. 5d.

FIG. 5f is an illustration of a cross-sectional view showing the formation of NMOS and PMOS transistors on the substrate of FIG. 5e.

DETAILED DESCRIPTION OF THE PRESENT INVENTION

A novel CMOS integrated circuit having PMOS and NMOS devices with different gate dielectric layers is described. In the following description numerous specific details are set forth, such as specific materials, dimensions, and processes, in order to provide a thorough understanding of the present invention. It will be obvious, however, to one skilled in the art that the present invention may be practiced without these specific details. In other instances, well known semiconductor equipment and processes have not been described in particular detail in order to avoid unnecessarily obscuring the present invention.

The present invention is a novel CMOS integrated circuit. According to the present invention, the PMOS transistors have a gate dielectric layer with dielectric properties which optimize the performance and reliability of the PMOS transistor, while the NMOS transistors have a gate dielectric layer with dielectric properties, different than the PMOS transistors', which optimize performance and reliability of the NMOS transistor. By utilizing different gate dielectric layers for the PMOS devices and the NMOS devices, performance and reliability of both types of transistors are maximized or optimized which in. turn improves the reliability and performance of the resulting CMOS integrated circuit.

FIG. 2 shows a complimentary metal oxide semiconductor (CMOS) integrated circuit 200 in accordance with the present invention. CMOS integrated circuit 200 includes a n channel metal oxide semiconductor (NMOS) transistor 210 formed over a p-type conductivity region or p well 212 of a semiconductor substrate 202 and a p-channel metal oxide semiconductor transistor (PMOS) 250 formed on an n-type conductivity region or n well 252 of semiconductor substrate 202. NMOS device 210 and PMOS device 250 are electrically isolated in substrate 202 by isolation region 204.

NMOS device 210 includes a gate electrode 214 and a pair of n-type conductivity source/drain regions 216 which preferably include a pair of n-type conductivity source/drain extensions or tips 218 located beneath a pair of sidewall spacers 219. NMOS device 210 also includes an NMOS gate dielectric 220 formed on p well 212 and beneath gate electrode 214.

PMOS device 250 includes a gate electrode 254 and a pair of p-type conductivity source/drain regions 256 which preferably include a pair of p-type conductivity source/drain extensions or tips 258 located beneath a pair of sidewall spacers 259. PMOS device 250 also includes a PMOS gate dielectric layer 260 formed on n well 252 and beneath gate electrode 254. PMOS gate dielectric layer 260 has different composition and different dielectric properties than NMOS gate dielectric layer 220.

According to the present invention, NMOS device 210 and PMOS device 250 are coupled together to form a CMOS integrated circuit. In the CMOS integrated circuit of the present invention, NMOS device 210 is either turned one by being placed in the "inversion mode" or is turned "off" by allowing it to sit idle (i.e., no potential difference exists between terminals). To place NMOS device 210 in inversion mode, a positive gate voltage ($Y_{gs} > V_t$) (i.e., gate electrode voltage minus source voltage is greater than the threshold voltage of NMOS device 210) is applied to gate electrode 214 of NMOS device 210 in order to form an n-type conductivity inversion layer 230 in p well 212 beneath gate electrode 214 and between source/drain regions 216 to thereby turn on the NMOS device 210 by allowing electrons to flow from one source/drain region 216 to the other source/drain region 216 through the created inversion channel region 230. Similarly, in the CMOS integrated circuit of the present invention PMOS device 250 is either turned "on" by being placed in the "inversion mode" or is turned "off" by allowing it to sit idle, (i.e., no potential difference between terminals). To place PMOS device 250 in inversion mode, a negative gate voltage, ($V_{gs} < V_t$), (i.e., gate voltage minus source voltage is less than the threshold voltage of PMOS device 250) is applied to the gate electrode 254 of PMOS device 250 in order to form a p-type conductivity inversion channel 270 in n well 252 beneath gate electrode 254 and between source/drain regions 256 to thereby turn on the PMOS device 250 by allowing holes to flow from one source/drain region 256 to the other source/drain region 256 through the created p-type conductivity inversion channel 270. In the CMOS integrated circuit of the present invention only discrete operating voltages of Vcc and Vss are applied to the PMOS and NMOS transistors. According to the present invention, the power supply voltage, Vcc, is preferably 1.3 volts but may be other standard operating voltages such as 5.0 volts or 3.3 volts, and Vss is preferably ground.

NMOS gate dielectric layer 220 and PMOS gate dielectric layer 260 have different compositions and different dielectric properties so that the performance and reliability of NMOS transistor 210 and PMOS transistor 250, respectively, are optimized. The dielectric properties of NMOS gate dielectric layer 220 are chosen to provide improved channel electron mobility with respect to PMOS dielectric layer 260, while the dielectric properties of the PMOS gate dielectric layer 260 provide improved channel hole mobility with respect to NMOS gate dielectric layer 220. By increasing or maximizing the mobility of the respective carriers of each transistor, device speed is increased and performance improved. Additionally, the dielectric properties of PMOS gate dielectric 260 are chosen to provide a barrier to hole injection into gate dielectric layer 260 from the p-type inversion layer 270 formed in n-well 252. Preventing hole injection into gate dielectric layer 260 is important in order to prevent hole trapping and resultant threshold voltage shift, which in turn can lead to reliability problems. It is to be appreciated that hole trapping is a more significant problem than electron trapping because holes are heavier than are electrons and therefore less mobile than electrons in the dielectric and so are trapped easier than electrons.

Applicant has recently discovered that the effective mobilities of PMOS and NMOS devices are affected differently by different gate dielectrics. For instance, applicant has discovered, as illustrated in FIG. 3a, that the n channel effective mobility is greater for a transistor having a 20 Å nitrided gate oxide layer 302 than for a transistor having a 20 Å pure thermal oxide gate dielectric layer 304. Additionally, applicant has discovered, as illustrated in FIG. 3b, that the p channel mobility (i.e., transistor channel mobility) is greater for an MOS transistor having a 20 Å pure thermal oxide layer 306 than for an MOS transistor having a 20 Å nitrided gate oxide layer 308. These findings show that in order to optimize circuit performance of a CMOS integrated circuit, the PMOS and NMOS devices should have different dielectric properties.

A preferred composition of NMOS gate dielectric layer 220 is shown in FIG. 2. NMOS gate dielectric layer 220 has a preferred thickness of between 20–50 Å. NMOS gate dielectric layer 220 includes a bottom dielectric layer 222 which is preferably a high dielectric constant material 222 (dielectric constant greater than pure silicon dioxide) formed at the substrate/gate dielectric interface. Bottom dielectric layer 222 is preferably a nitrided silicon dioxide film containing between 0.10–5.0 atomic % nitrogen with 1% preferred, confined within 5–10 Å from the gate dielectric/substrate interface. Although a nitrided silicon dioxide layer is the preferred bottom dielectric layer 222, for NMOS gate dielectric 220 because of good channel electron mobility other high k materials such as, but not limited to, aluminum oxide ($Al_2O_3$), silicon nitride ($Si_xNy$) and titanium oxide ($Ti_xOy$) may be utilized if desired. A high dielectric constant material (dielectric constant greater tan silicon dioxide) is desirable because it allows a thicker gate dielectric layer to be fabricated while providing a sufficiently high capacitance. NMOS gate dielectric layer 220 also includes an upper layer 224 which is preferably substantially pure silicon dioxide ($SiO_2$). The top portion of 226 of upper layer 224 of gate dielectric layer 220 may be made nitrogen rich, if desired, in order to help prevent impurity diffusion from gate electrode 214 into gate dielectric layer 220. A nitrided silicon dioxide layer at the gate dielectric/substrate interface, improves the channel electron mobility of the transistor is improved as compared to an oxide layer free of nitrogen.

A preferred PMOS gate dielectric layer 260 is shown in FIG. 2. PMOS gate dielectric layer 260 is preferably between 20–50 Å thick. PMOs gate dielectric layer 260 has a bottom layer 262 at the gate dielectric/substrate interface which comprises substantially pure silicon dioxide. By utilizing a substantially pure silicon dioxide layer at the gate dielectric/substrate interface, hole mobility of the transistor is improved as compared to a nitrided oxide layer. Additionally, by keeping bottom layer 262 substantially free of nitrogen, hole injection into the gate dielectric layer 260 from channel 270 is substantially reduced as compared with a gate dielectric layer having a nitrided silicon dioxide layer at the substrate/gate dielectric interface.

PMOS gate dielectric layer 260 also has a top gate dielectric layer 264 formed on lower gate dielectric layer 262. Top layer 264 is preferably a high dielectric constant material (dielectric constant greater than silicon dioxide) in order to allow a thicker gate dielectric layer to be fabricated while keeping the gate capacitance sufficiently high. Top layer 264 is preferably a nitrided oxide layer with between 0.1–5.0 atomic % nitrogen with 1% preferred confined within the top 5–10 Å of PMOS gate dielectric layer 260. A top dielectric layer 264 comprising a nitrided oxide also provides a barrier for blocking boron penetration from gate electrode 254. Additionally, although top layer 264 is preferably a nitrided silicon dioxide layer, other high k material such as, but not limited to, aluminum oxide ($Al_xO_y$), silicon nitride ($Si_xN_y$) and titanium oxide ($Ti_xO_y$) may be utilized, if desired. It is to be appreciated that because the high k material 264 is positioned away from the substrate/gate dielectric interface where the p-type inversion layer is created, hole injection and trapping in the PMOS gate dielectric layer 262 is substantially reduced. Reduction of hole trapping in PMOS gate dielectric layer 262 prevents changes in the threshold voltage of PMOS transistor 250.

A preferred method of forming CMOS integrated circuit 200 is illustrated in FIGS. 4a–4e. According to the present invention, as shown in FIG. 4a, a semiconductor substrate, such as a silicon substrate 400, is provided. Field isolation regions 401 are formed in substrate 400 to isolate wells of different conductivity types into isolate adjacent transistors. Field isolation regions 401 are preferably shallow trench isolation (STI) regions formed by etching the trench of substrate 400 and then filling the trench with a deposited oxide. Although STI isolation regions are preferred because of their ability to be formed to small dimension with high degree of planarity, other method can be used, such as but not limited to, LOCOS, recess LOCOS, or silicon on insulator (SOI) and suitable insulators other than oxide such as rutride may be used, if desired.

Next, a sacrificial oxide layer 402 having a thickness of between 100–300 Å with approximately 200 Å being preferred is formed over substrate 400. Next, a photoresist mask 403 is formed over substrate 400 with well known techniques. Photoresist mask 403 masks those areas of substrate 400 which are to become p-type conductivity regions or wells, and exposes or reveals those portions of substrate 400 which are to become n-type conductivity regions or wells. Next, an n-type conductivity region or n well 404 is formed in substrate 400. N-type conductivity region or well 404 may be formed by a first implant of phosphorus atoms at a dose of $4 \times 10^{13}/cm^2$ and an energy of 475 keV, a second implant of phosphorous atoms at a dose of $2.5 \times 10^{12}/cm^2$ at an energy of 60 keV, and a final implant of arsenic atoms at a dose of $1 \times 10^{13}/cm^2$ at an energy of 180 keV into a silicon substrate 400 having a concentration of $1 \times 10^{16}/cm^3$ in order to produce an n well 404 having an n-type concentration of approximately $7 \times 10^{17}/cm^3$.

Next, as shown in FIG. 4b, photoresist mask 403 is removed with well known techniques and second photoresist mask 406 is formed over substrate 400. Photoresist mask 406 covers n well 404 and exposes those portions of substrate 400 which are to become p-type conductivity regions or wells. Next, a p-type conductivity region or well 408 is formed in substrate 400 and shown in FIG. 4b. A p well can be formed by a first implant of boron atoms at a dose of $3 \times 10^{13}/cm^2$ at an energy of 230 keV, followed by a second implant of boron atoms at a dose of $4.2 \times 10^{13}/cm^2$ at an energy of 50 keV into substrate 400 in order to produce a p well having a p-type concentration of $7.0 \times 10^{17}/cm^3$.

Next, nitrogen (N) is implanted into substrate 400 through-sacrificial oxide layer 402 as shown in FIG. 4b Sacrificial oxide layer 402 slows down the implant of nitrogen so that the majority of the nitrogen atoms form a nitrogen rich area 410 located at the surface of substrate 400 in p well 408. Photoresist mask 406 prevent n well 404 from being implanted with nitrogen. Nitrogen rich area 410 can be formed by implanting nitrogen at a dose of between $5 \times 10^{12}/cm^2 - 1 \times 10^{15}/cm^2$ with $3 \times 10^{13}/cm^2$ being preferred, and an energy of between 5–40 keV with 25 keV being preferred.

Next, as shown in FIG. 4c, photoresist mask 403 is stripped with well known techniques. Additionally, sacrificial oxide layer 402 is also removed at this time. Sacrificial oxide layer 402 can be removed using a well known hydrofluoric acid etchant or an "HF dip". It is to be appreciated that the nitrogen rich substrate region 410 remains after photoresist 406 and sacrificial oxide layer 402 have been removed, as shown in FIG. 4c.

Next, as shown in FIG. 4d, a gate oxide layer 412 is formed over substrate 400. Oxide layer 412 is preferably a robust thermally grown oxide layer which is grown to a thickness of between 20–50 Å. Oxide layer 410 is preferably grown with a two step dry/wet oxidation process at between 650°–750° C. A dry/wet oxidation process comprises a first dry oxidation which is carried out a temperature of between 650°750° C. in the presence of trichlorethane (TCA) and $O_2$. In the second step of a dry/wet oxidation process, substrate 400 is subjected to a wet oxidation (pyrogenic steam) where substrate 400 is subjected to $H_2O$ formed by torching $O_2$ and $H_2$ at a temperature between 650°–750° C. A dry/wet oxidation process is known to form a robust gate dielectric layer. An example of two step dry/wet oxide growth process is described in U.S. Pat. No. 5,244,843, assigned to the present assignee, and is hereby incorporated by reference.

It is to be noted that because of the prior formation of nitrogen rich area 410 on p well 408, when gate oxide layer 412 is grown over p well 408, it becomes nitrogen rich silicon dioxide 414 at the gate/oxide substrate interface. In the present method gate oxide layer 412 contains between 0.10–5.0% atomic % nitrogen with 1% being preferred at the gate oxide layer/substrate interface. However, since no nitrogen was implanted into n well 404, gate oxide layer 412 over n well 404 is substantially free of nitrogen and remains substantially pure silicon dioxide.

Next, if desired, gate oxide layer 412 is subjected to a nitridation process, as shown in FIG. 4d. The purpose of the nitridation process is to form a nitrogen rich, between 0.10–5.0 atom % nitrogen, with 1% preferred, on a top surface 416 (e.g., top 5–10 Å) of gate oxide layer 410 in order to block subsequent impurity penetration from polysilicon electrode. Gate oxide layer 412 can be nitrided utilizing a room temperature plasma nitridation process where a flow of approximately 100 sccm of nitrogen ($N_2$) at a pressure of between 2.7–5.3 millitorr and with a power of between 500–2000 watts. Alternatively, oxide layer 412 can be nitridated utilizing a rapid thermal anneal in an ambient comprising ammonia ($NH_3$) at a temperature of less than 800° C.

Next, well known processes are used to form NMOS transistor 420 and PMOS transistor 422 over p well 408 and n well 404, respectively. For a example, a polysilicon layer can be blanket deposited (2500–3500 Å thick) over gate oxide layer 412 and patterned into gate electrodes 424 and 426. N-type source/drain regions 428 and p-type source/drain regions 430 can then be formed, for example by ion implantation, on opposite sides of gate electrode 424 and 426, respectively. Additionally, if desired, source/drain extensions or "tips" can be formed by utilizing well known sidewall spacers 432.

Once NMOS device 420 and PMOS device 422 are completed, they can be coupled together utilizing well known interconnection technology to form a CMOS integrated circuit. It is to be appreciated that the process of the present invention has created an NMOS device 420 having a gate dielectric layer 440 characterized by a nitrogen rich silicon dioxide layer at the gate dielectric 440/substrate interface, while PMOS device 422 has a second different gate dielectric layer 442 which is substantially free of nitrogen at the gate dielectric layer 442/silicon substrate interface 404. In this way, the performance and reliability of NMOS device 420 and PMOS device 422 are optimized.

FIGS. 5a–5f illustrate a second method of forming a CMOS integrated circuit wherein the PMOS and NMOS devices have different gate dielectric layers. The method of FIGS. 5a–5f is useful to produce PMOS and NMOS gate dielectric layers which have compositions which are inverse to one another.

According to this embodiment of the present invention, a semiconductor substrate 500 is provided having an isolation region 501, a p well 502, and an n well 504. Isolation region 501, p well 502, and n well 502 are formed as described above. Additionally, any sacrificial oxide layer used for p well and n well-formations have been removed at this time.

Next, as shown in FIG. 5b, a thin oxide layer 506 is formed over p well 502 and n well 504 of substrate 500. Oxide layer 506 is preferably a thermally grown oxide layer grown to a thickness of between 20–50 Å. Oxide layer 506 is preferably a robust thermally grown oxide layer grown utilizing a dry/wet oxidation process as described above.

Next, as shown in FIG. 5c, a photoresist mask 508 is formed on n well 504. Next, as also shown if FIG. 5c, an HF dip is utilized to remove silicon dioxide layer 506 formed over p well 502. Mask 508 protects oxide layer 506 on n well 504 from being etched. After removing oxide layer 506 from p well 502, photoresist mask 508 is removed with well known techniques.

Next, as shown in FIG. 5d, a high dielectric constant material (i.e., a material having a dielectric constant greater than silicon dioxide) is deposited onto p well 502 of substrate 500 and onto oxide layer 506 over n well 504 of substrate 500. High dielectric constant material 508 is preferably silicon nitride deposited by a "hot wall process". A silicon nitride layer 508 can be formed by low pressure chemical vapor deposition (LPCVD) process by reacting ammonia ($NH_3$) and dichloralsiline (DCS) at a pressure of approximately 10 pascales and a temperature of approximately 800° C. It is to be appreciated that although silicon nitride is the preferred high dielectric constant material of the present invention, other high dielectric constant material such as aluminum oxide and titanium oxide may be utilized, if desired. Any well known and suitable technique such as implanting an oxide with aluminum or titanium may be utilized to form the aluminum oxide layer or titanium oxide layer.

Next, as also shown in FIG. 5d, a thin oxide layer 510 is formed over a high dielectric constant material 508 over p well 502 and n well 504. Oxide layer 510 can be formed onto a silicon nitride layer by chemical vapor deposition or by utilizing a wet-oxidation (steam oxidation) at approximately 800° C. Although other dielectric layers may be used in place of oxide layer 510, a substantially pure oxide layer is desirable because it helps reduce hole injection from polysilicon gate electrode into the gate dielectric layer of the NMOS device when the NMOS device is turned "on".

Next a photoresist mask 512 is formed on oxide layer 510 over p well 502 as shown in FIG. 5e. An HF dip is then utilized to remove oxide layer 510 from silicon nitride layer 508 over n well 504. Photoresist mask 512 prevent oxide layer 510 over p well 502 from being removed.

Next, as shown in FIG. 5f, photoresist mask 512 is removed and NMOS 520 and PMOS 522 devices fabricated with well known techniques over p well 502 and n well 504, respectively. For example, a polysilicon layer can be blanket deposited (2500–3500 Å thick) over substrate 500 and patterned into gate electrodes 524 and 526. N-type source/drain regains 528 and p-type source/drain regains 530 can then be formed, for example by ion implantation, on opposite sides of gate electrode 524 and 526, respectively. Additionally, if desired, source/drain extension or "tips" can be formed by utilizing well known sidewall spacers 532. It is to be appreciated that the present method has fabricated an NMOS transistor with a gate dielectric layer 540 which is inverse to the gate dielectric layer 542 of PMOS device 522. That is, NMOS transistor 520 has a gate dielectric layer 540 comprising a lower silicon nitride layer and a top silicon dioxide layer, while PMOS transistor has a gate dielectric layer 542 comprising a lower silicon dioxide layer and a top silicon nitride layer.

Alternative embodiments and specifics of the present invention have it been described, however, one skilled in the art will appreciate that many features of one embodiment are equally applicable to the other embodiment. Additionally, although many specific dimensions, materials and process perimeters and concentrations have been described, it is to be appreciated that these specific dimensions, materials, concentrations and processes are not to be taken as limited. The scope of the present invention is not intended to be limited to the detailed description of the present invention, and rather is to be determined by the claims which follow.

Thus a novel CMOS integrated circuit having PMOS and NMOS devices with different gate dielectric layers have been described.

I claim:

1. A CMOS integrated circuit comprising:

a NMOS transistor formed on a p-type conductivity region, said NMOS transistor having a first gate dielectric layer formed on said p-type conductivity region said NMOS transistor having a first gate electrode formed on said first gate dielectric and a pair of n-type source/drain regions on opposite side of said first gate electrode, first gate electrode coupled to either Vcc or Vss; and a PMOS transistor formed on a n-type conductivity region, said PMOS transistor having a second gate dielectric layer wherein said second gate dielectric layer has a different composition than said first gate dielectric layer said PMOS transistor having a second gate electrode formed on said second gate dielectric layer and a pair of p-type source/drain regions formed on opposite sides of said second gate electrode, said second gate electrode coupled to either Vcc or Vss.

2. The integrated circuit of claim 1 wherein said first gate dielectric layer is nitrogen rich at the gate dielectric/substrate interface and wherein said second gate dielectric layer is less nitrogen rich at the gate dielectric/substrate interface than said first gate dielectric layer.

3. The integrated circuit of claim 2 wherein said second gate dielectric layer comprises substantially pure silicon dioxide at the substrate/gate dielectric interface.

4. The integrated circuit of claim 1 wherein said first dielectric layer comprises a silicon nitride layer formed on said p-type conductivity region and a silicon dioxide layer formed on said silicon nitride layer;

wherein said second dielectric layer comprises a silicon dioxide layer formed on said n-type conductivity region and a silicon nitride layer formed on said silicon dioxide layer.

5. The integrated circuit of claim 1 wherein said first gate dielectric layer comprises:

a first dielectric layer formed on said p-type conductivity region and a second dielectric layer formed on said first dielectric layer wherein said second dielectric layer is different than said first dielectric layer; and wherein said second gate dielectric layer comprises said second dielectric layer formed on said n-type conductivity region and said first dielectric layer formed on said second dielectric layer.

6. The integrated circuit of claim 5 wherein said first dielectric layer has a dielectric constant greater than silicon dioxide.

7. The integrated circuit of claim 1 wherein the voltage applied to the gate of the PMOS transistor is either Vss or Vcc and when the voltage applied to the gate of the NOMOS transistor is either Vss or Vcc.

8. The integrated circuit of claim 5 wherein said second dielectric layer is silicon dioxide.

9. The integrated circuit of claim 5 wherein said first dielectric layer is aluminum dioxide.

10. The integrated circuit of claim 5 wherein said second dielectric layer is titanium oxide.

11. The integrated circuit of claim 1 wherein said first gate dielectric layer comprises an oxide with between 0.10–5.0 atomic percent of nitrogen confined within the bottom 5–10 Å of said first gate dielectric.

12. The integrated circuit of claim 1 wherein said second gate dielectric layer comprises an oxide with between 0.10–5.0 atomic percent of nitrogen confined within the top 10 Å of said oxide.

13. An integrated circuit comprising:

a NMOS transistor formed on a p-type conductivity region, said NMOS transistor having a first gate dielectric layer formed on said p-type conductivity region said NMOS transistor having a first gate electrode formed on said first gate dielectric and a pair of n-type source/drain regions on opposite sides of said first gate electrode, said first gate electrode coupled to either Vcc or Vss; and a PMOS transistor formed on a n-type conductivity region, said PMOS transistor having a second gate dielectric layer wherein said second gate dielectric layer has different dielectric properties than said first gate dielectric layer said PMOS transistor having a second gate electrode formed on said second gate dielectric layer and a pair of p-type source/drain regions formed on opposite sides of said second gate electrode, said second gate electrode coupled to either Vcc or Vss.

14. The integrated circuit of claim 13 wherein said second gate dielectric layer provides a higher barrier to hole injection from said substrate than does said first gate dielectric layer.

15. The integrated circuit of claim 13 wherein said first gate dielectric layer provides a higher barrier to hole injection than does said second gate dielectric layer.

16. The integrated circuit of claim 13 wherein said first gate dielectric layer provides higher channel electron mobility than does said second gate dielectric layer.

17. The integrated circuit of claim 13 wherein said second gate dielectric layer provides higher channel hole mobility than said first gate dielectric layer.

18. A CMOS integrated circuit comprising:

a NMOS transistor formed on a p-type conductivity region, said NMOS transistor having a first gate dielectric layer formed on said p-type conductivity region, and a PMOS transistor formed on a n-type conductivity region, said PMOS transistor having a second gate dielectric layer wherein said second gate dielectric layer has a different composition than. said first gate dielectric layer and wherein said NMOS transistor is coupled to said PMOS transistor.

19. An integrated circuit comprising a NMOS transistor formed on a p-type conductivity region, said NMOS transistor having a first gate dielectric layer formed on said p-type conductivity region; and a PMOS transistor formed on a n-type conductivity region, said PMOS transistor having a second gate dielectric layer wherein said second gate dielectric layer has different dielectric properties than said first gate dielectric layer and wherein said NMOS transistor is coupled to said PMOS transistor.

20. A CMOS integrated circuit comprising:

a NMOS transistor formed on a p-type conductivity region, said NMOS transistor having a first gate electrode formed on a first gate dielectric layer formed on said p-type conductivity region and wherein said first gate electrode is coupled to a discrete voltage; and a PMOS transistor formed on a n-type conductivity region, said PMOS transistor having a second gate electrode formed on a second gate dielectric layer wherein said second gate dielectric layer has a different composition than said first gate dielectric layer and wherein said second gate dielectric is coupled to a discrete voltage.

21. An integrated circuit comprising:

a NMOS transistor formed on a p-type conductivity region, said NMOS transistor having a first gate electrode formed on a first gate dielectric layer formed on said p-type conductivity region and wherein said first gate electrode is coupled to a discrete voltage; and a PMOS transistor formed on a n-type conductivity region, said PMOS transistor having a second gate electrode formed on a second gate dielectric layer wherein said second gate dielectric layer has different dielectric properties than said first gate dielectric and wherein said second gate electrode is coupled to a discrete voltage.

* * * * *